April 21, 1970 D. E. CUZNER 3,508,117

CIRCUIT ASSEMBLY

Filed July 1, 1968 4 Sheets-Sheet 1

*INVENTOR*
DAVID E. CUZNER

BY Joseph L. Spiegel
ATTORNEY

April 21, 1970 D. E. CUZNER 3,508,117

CIRCUIT ASSEMBLY

Filed July 1, 1968 4 Sheets-Sheet 2

April 21, 1970 D. E. CUZNER 3,508,117

CIRCUIT ASSEMBLY

Filed July 1, 1968 4 Sheets-Sheet 3

United States Patent Office 3,508,117
Patented Apr. 21, 1970

3,508,117
CIRCUIT ASSEMBLY

David E. Cuzner, Romsey, England, assignor to International Business Machines Corporation, Armonk, N.Y., a corporation of New York Filed July 1, 1968, Ser. No. 741,700
Claims priority, application Great Britain, July 28, 1967, 34,757/67, 34,758/67
Int. Cl. H05k 7/20
U.S. Cl. 317—100 23 Claims

ABSTRACT OF THE DISCLOSURE

A circuit assembly, particularly suitable for mounting integrated circuit modules, is provided in which the circuit elements are closely spaced, interconnection lengths minimized and improved cooling provided. The circuit assembly comprises a plurality of parallel spaced-apart printed circuit cards each formed with a central aperture around which are disposed circuit modules. A tube, the walls of which are formed by apertured multi-layered circuit boards, extends through the apertures of all the circuit cards and provides the interconnections between different circuit cards. The connections between the circuit cards and the circuit boards of the tube are provided by spring fingers fixed to the circuit cards and cammed into contact with the circuit boards of the tube. The tube communicates with a central air box and directs cooling air at the modules on the circuit cards through the apertures in the multi-layered circuit boards.

BACKGROUND OF THE INVENTION

This invention relates to circuit assemblies.

With continued improvement of the speed of circuit elements, be they simple transistors or integrated circuits, the delay for electrical pulses passing between interconnected circuit elements has become comparable to the delay in the circuit elements themselves. It is thus important to provide a circuit assembly in which the circuit elements are closely packed and the interconnection lengths minimized as far as possible.

For all circuit assemblies there are requirements which conflict with this requirement of short interconnection length. Each circuit element must be maintained at a uniform temperature within its working range of temperatures. It is also necessary to ensure reliability, provision for testing the circuits in the assembly, provision for replacement of faulty elements, and in many applications provision for minor changes of the circuitry in the assembly resulting from improvements in circuit design and the necessity which may arise from time to time of providing additional features and functions within the circuit.

In a typical prior art circuit assembly circuit modules are solder connected to rectangular printed circuit cards. The input/output connections to the circuitry of each card are brought out to printed circuit lands at the edge of the card. A large number of the cards are inserted into electrical connectors on a large printed circuit board, sometimes referred to as a "mother board". The minimum interconnection distance between circuit elements mounted at the edges of circuit cards remote from the edge connected to the mother board is about $2a+b$ where $a$ is the length of the card and $b$ is the distance between the cards.

At the same time, advances in semiconductor devices particularly the development of integrated circuits have brought a considerable decrease in the size of electronic components. The increase in packing density of circuits rendered possible by this reduction in size has resulted in an increase in the amount of heat dissipated per unit in a circuit assembly. Consequently the need has arisen for improved methods of cooling circuit assemblies.

In a typical prior art circuit assembly the circuit elements are mounted on printed circuit cards which are themselves mounted on a larger printed circuit board which provides electrical interconnections between the circuit cards. Cooling air is passed over the board from one end to the other and passes over a number of circuit cards in succession. It will be appreciated that a significant increase in the temperature of the cooling air takes place as it passes over successive circuit cards. Restrictions are imposed on the logic designer because high powered circuit elements dissipating a relatively large quantity of heat must be mounted at the relatively hot end of the circuit board so that not all the elements of the assembly are in a current of cooling air which has been heated by such high powered circuit elements.

SUMMARY OF THE INVENTION

According to one aspect of the invention a circuit assembly comprises a plurality of printed circuit cards, each supporting and providing interconnections between a plurality of circuit elements arranged around a central aperture in the card, and interconnecting means extending through the apertures in the cards for interconnecting circuit elements supported on different cards.

In a circuit assembly embodying the invention the minimum interconnection distance between any circuit element mounted at the outer edges of the cards is about $a+b$ where $a$ is the length of the card and $b$ is the distance between the cards.

According to another aspect of the invention, the interconnection means provided are in the form of a tube having walls constructed of printed circuit boards which beside providing printed circuit interconnections between the circuit cards also forms a duct for cooling air. Preferably the tube is apertured at points in registry with the spaces between the cards and cooling air is passed along the tube through the apertures in the tube and over the circuit elements mounted on the cards.

A circuit assembly embodying the invention is particularly suitable for mounting circuit elements in the form of integrated circuit modules.

Preferably each printed circuit card is formed with a central aperture and the tube extends through the apertures of the cards.

In a circuit assembly embodying the invention each circuit card is provided with an individual flow of cooling air which has not previously passed over circuit elements of other cards.

BRIEF DESCRIPTION OF THE DRAWING

The invention will now be described with reference to the accompanying drawings, in which.

GENERAL DESCRIPTION

Figure 1:
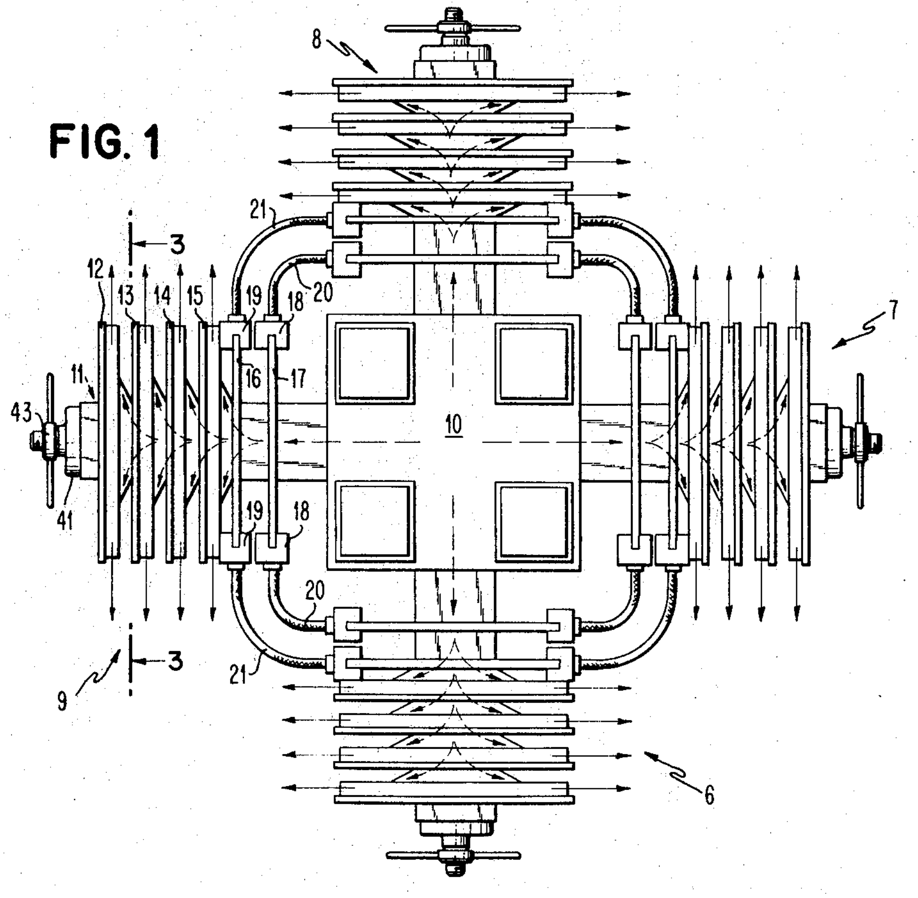
FIGURE 1 is a diagrammatical plan view of a circuit assembly embodying the invention.

A circuit assembly embodying the features of the invention is shown diagrammatically in FIGURE 1 and comprises a central air distribution box 10 of square cross section, and four sub-assemblies, 6 through 9 projecting one from each face of the central air distribution box 10. Only sub-assembly 9 will be described since the remaining sub-assemblies 6 through 8 are similar in construction.

Sub-assembly 9 comprises an air distribution tube 11 communicating with the air box 10 and a plurality of apertured multi-layered printed circuit cards 12 through 17 assembled thereon.

The printed circuit cards 12 through 15 each carry a plurality of micro-modules and provide the interconnection wiring required between those modules. The logic input/output connections required to the modules on a card are brought to printed circuit lands at the edge of the central aperture of the card. Interconnecting means are provided for establishing electrical contact between these printed lands at the edges of the card and printed circuit lands on the air distribution tube 11. The air distribution tubes are of square cross section and constructed from four multilayered printed circuit boards. The printed circuit wiring of the air distribution tube 11 provides the wiring interconnections between the printed circuit cards 12, 13 14 and 15. The input/output connections to the group of cards 12, 13, 14, 15 are taken along the air distribution tube towards the central air distribution box 10 and brought out to further printed lands on the outer surface of the tube. Printed circuit cards 16 and 17 also have printed circuit lands at the edges of their apertures which are connected to the corresponding printed circuit lands on the air distribution tube 11 by interconnecting means similar to those which interconnect circuit cards 12, 13, 14 and 15 to the air distribution tube 11. However the cards 16 and 17 do not carry micro modules but provide electrical connections to further printed circuit lands at their outer edges. Conventional connectors 18 and 19 provide electrical connections from the printed circuit lands at the outer edges of interconnection cards 16 and 17 through tape cables 20 and 21 to further conventional interconnecting means connected to interconnecting cards in sub-assemblies 6 and 8. The interconnecting cards 16 and 17 also provide input/output connections between the circuit assembly as a whole and the outside world.

Cooling of the micro modules mounted on the circuit cards 12, 13, 14 and 15 is effected by a stream of cooling air which passes from the central air distribution box through holes in the air distribution tubes 11 between the circuit cards and radially outwardly of the air distribution tube between the adjacent circuit cards 12 and 13, 13 and 14, 14 and 15 over the micro modules mounted on those cards. The stream of cooling air may be provided by a fan connected to the central air distribution box 10 by a duct (not shown).

Having described the general construction of the circuit assembly the individual components and their interrelation will be described in more detail below.

DETAILED DESCRIPTION

Modules

Figure 2:
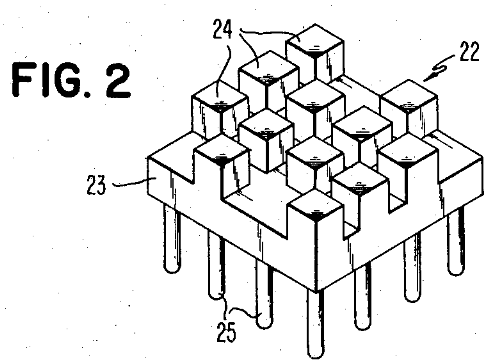
FIGURE 2 is a perspective view of a micro-module suitable for use in the circuit assembly shown in FIGURE 1.

Each module 22 is preferably of a construction which maximizes the heat dissipation therefrom to the current of air which passes over it. The modules may be of the general configuration shown in FIGURE 2 having integrated circuits (not shown) mounted on a substrate (not shown) and encapsulated in metal can 23 having metal extension pins 24 of square cross section projecting from the upper surface of the can. The square section pins 24 provide a turbulent flow of the air over the module and improve the exchange of heat between the module and the cooling air. Extension pins of other shapes may be used, for example, pins of paraboloid shape have good heat exchange characteristics.

From the lower surface of the substrate project interconnecting pins 25 which are soldered into holes in the circuit cards to provide electrical connections to the circuits in the module. Alternatively the modules may be provided with contact tabs soldered directly to printed circuit lands on the cards.

Circuit cards

Figure 3:
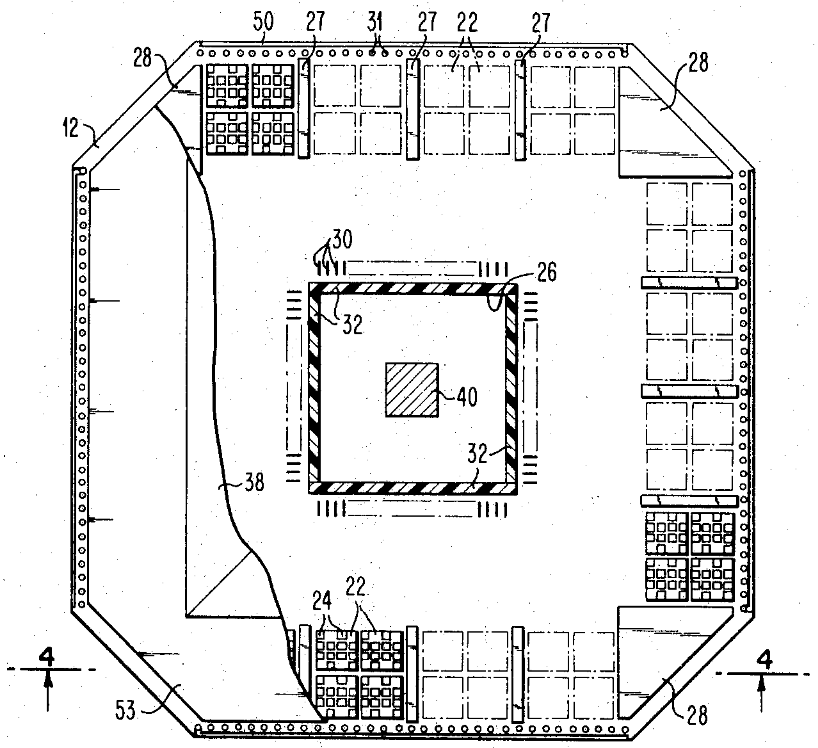
FIGURE 3 is a plan view partially broken away of a circuit card of the circuit assembly of FIGURE 1.
Figure 4:
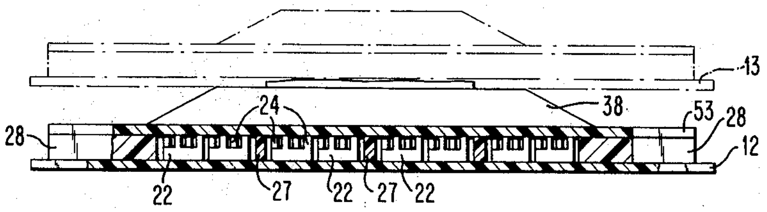
FIGURE 4 is an end view of the circuit card of FIGURE 3 in assembled relationship with a circuit card spacer.

Referring now to FIGURES 3 and 4 each circuit card 12 through 15 is a multilayered structure formed with a central square aperture 26. The circuit modules 22 are arranged on one side of the card and distributed around the central aperture as shown in FIGURE 3. The modules are arranged in closely packed groups of 4 separated by spacers 27 and 28 which close the gaps between the groups of modules so that the flow of air is directed over the modules. This aspect of the construction will be more fully appreciated by reference to FIGURE 4 which is an end view of the circuit card shown in FIGURE 3 in juxtaposition with a baffle 38, described in more detail below, which confines the air flow from the central air distribution tube 11 to pass over the metal pins 24 of the modules.

The input/output logic connections to the circuit card are brought out to printed circuit lands 30 on both faces of the card around the central aperture 26. Spring fingers 51 (see FIGURE 7) for contacting corresponding printed circuit lands on the air distribution tube 11 are soldered to the printed circuit lands 30 on the cards. Rows of plated through holes are provided at the outer edges of the circuit card 12 to provide points for testing the circuitry on the card. The plated through holes are connected by printed wiring in the card to points in the circuitry of the card which may from time to time require to be tested. Printed circuit strips 50 at the extreme edges of the card are connected to ground potential so that testing of voltage levels in the assembly may be carried out with reference to ground potential.

The interconnection cards 16 and 17 are multilayered cards of similar shape to the circuit card shown in FIGURE 3 but they do not bear modules. They are provided with printed circuit lands around the edges of the central aperture for connection to the tube 11 and around the outer edges for connection to conventional card connectors.

Air distribution tube

Figure 5:
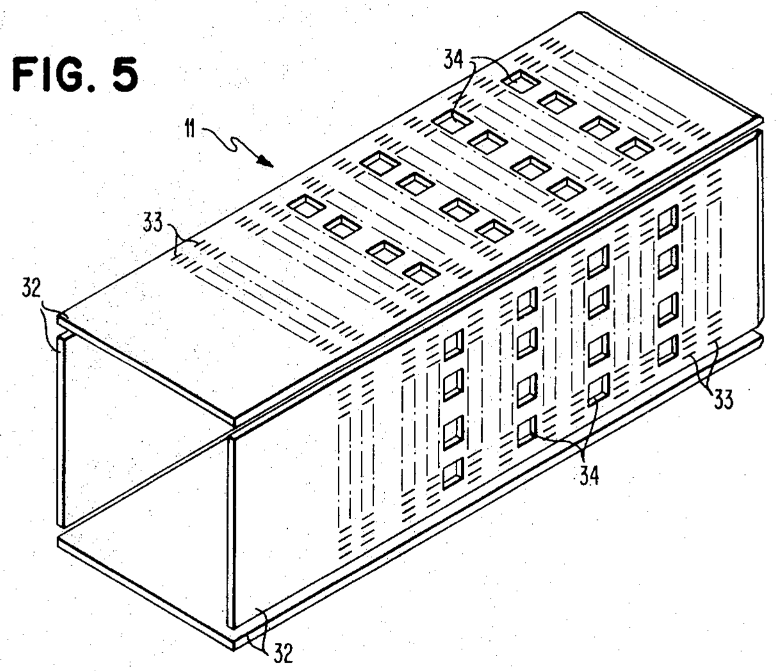
FIGURE 5 is an exploded perspective view of an air distribution tube of the circuit assembly of FIGURE 1.

One of the air distribution tubes is shown in FIGURE 5 and comprises four multilayered printed circuit boards 32 suitably supported to provide a rigid duct of square cross-section. Each board 32 is provided with a number of pairs of rows of printed circuit lands 33, each pair of rows corresponding to a circuit card or interconnection card. Between each pair of rows which correspond to a circuit card there is a space in the tube in which are formed a number of apertures 34 for the passage of cooling air to the modules carried by the circuit cards. When the circuit cards and the interconnection cards are assembled with the air distribution tube, the cards are each disposed between rows of printed circuit lands and the spring fingers 51 connect the printed circuit lands of central tube to the printed circuit lands on either side of the respective card.

Spacers

Figure 6:
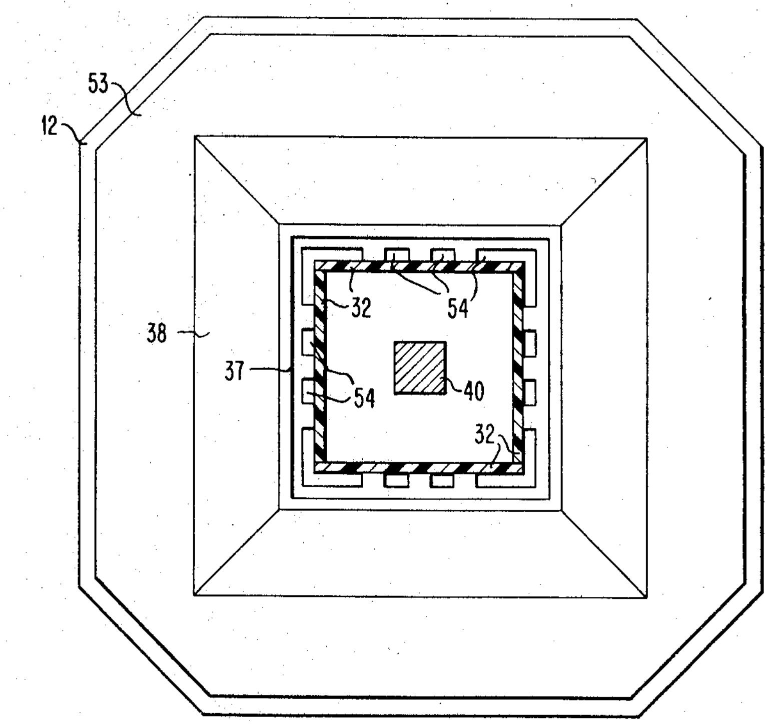
FIGURE 6 is a plan view of the circuit card spacer shown in FIGURE 4.
Figure 7:
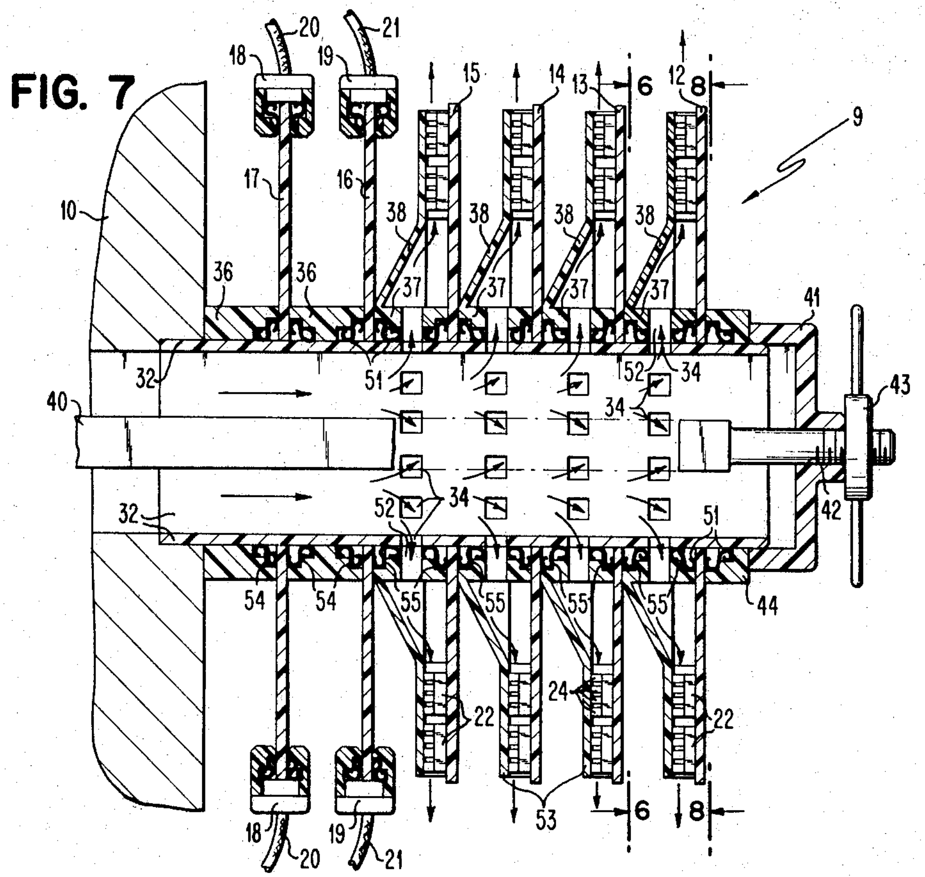
FIGURE 7 is cross-sectional side view of a sub-assembly of the circuit assembly of FIGURE 1.

Referring to FIGURES 6 and 7, the cards are spaced apart along the air distribution tube by spacers 36 and 37 which slide freely over the air distribution tube and are of such axial dimensions as to ensure that each card is positioned between its associated rows of printed circuit lands on the air distribution tube.

Spacers 37 (FIGURE 6) on the inner side of each circuit card are formed with apertures 52 which are arranged to register with the apertures 34 in the air distribution tube to permit air to flow from the tube into the space between adjacent cards. A baffle 38 on each spacer 37 directs the flow of air through apertures 52 from the air distribution tube over the extension pins 24 of the modules. The baffle 38 includes a portion 53 which presents a plane face towards the modules and is arranged to contact the spacers 27 and 28 on the circuit card (see FIGURE 4) so that the air flow out of the assembly passes only over the extension pins of the modules.

The contact pressure of the spring fingers 51 on the printed circuit lands of the air distribution tube must be adequate to ensure good electrical contact. Such pressures would cause excessive wear when the cards are passed along the tube into their operative positions. To overcome this problem the spring fingers are formed so that in their unstressed condition they do not exert substantial pressure on the tube. Camming surfaces 54 and 55 on the spacers 36 and 37 press the spring fingers down onto the tube as axial pressure is applied to the stack of cards and spacers from the outer end of the sub-assembly. The camming surfaces may be of such shape that they produce a wiping action of the spring fingers on the printed circuit lands to clear dirt or oxide film from the contacting surfaces.

Assembly

To assemble the circuit package a spacer 36 is initially threaded over the tube and passed down the tube to abut the air distribution box 10. Subsequently the first interconnecting card 17 is passed over the tube into contact with the spacer 36. A further interconnecting card spacer 36 is passed over the tube followed by a further interconnecting card. Then the first circuit card spacer is passed over the tube into contact with the second interconnecting card 16. This is followed by the first circuit card 15 which is passed over the tube with the circuit modules facing inwardly towards the air distribution box. Subsequent circuit card spacers and circuit cards are similarly passed over the central tube. A tie rod 40 extends down the centre of the air distribution tube from the air distribution box. A cap 41 with a central bore 42 is passed over the end of the interconnecting rod and screwed down by screw 43 onto an outer spacer 44 to axially compress all the spacers and circuit cards so that the spring fingers are cammed down onto the printed circuit lands on the distribution tube. The cap 41 is constructed to seal the end of the air distribution tube so that the air passed down the air distribution tube passes out only through the apertures of the tube and over the circuit modules. The connectors 18 and 19 shown in FIGURE 7 are conventional printed circuit card connectors and provide input/output connections to the sub-assembly.

The circuit cards and interconnection cards may be removed for replacement by reversal of the assembly procedure described above.

Power supplies

Figure 8:
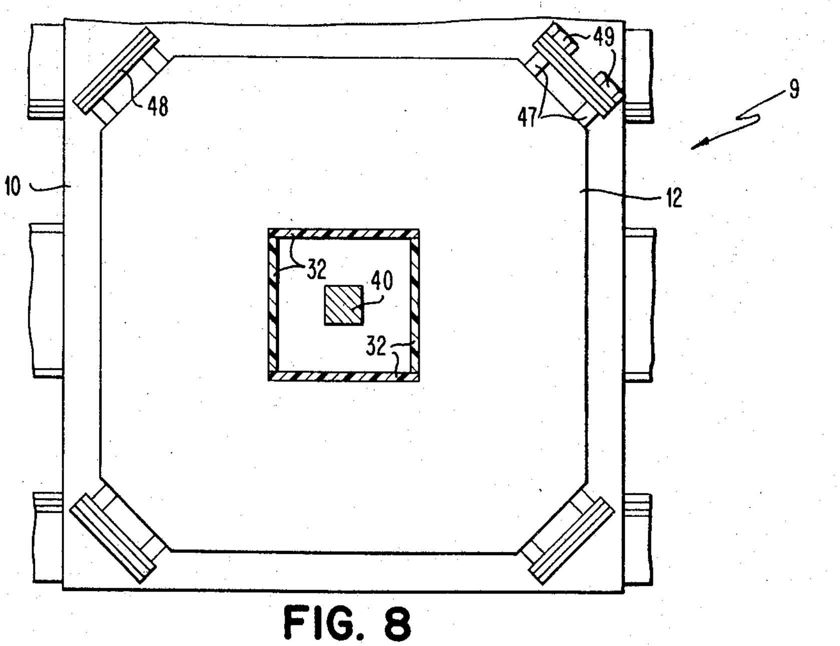
FIGURE 8 is an end view of the sub-assembly shown in FIGURE 7 showing a modification thereof.

The signal and logic connections between individual circuit cards are carried by the air distribution tube because this provides the minimum interconnection length between any two circuit elements. The power supply requirements of these circuit elements may be such it would be inconvenient to use the printed circuit wiring of the distribution tube for the power supply lines. Power buses 47 and 48 may be bolted to the outside of the circuit cards as shown in FIGURE 8. These power buses 47 and 48 extend outwardly from the central, air distribution box 10 parallel to the tube and after the circuit cards have been assembled on the air distribution tube connections are made through holes in the power buses to the circuit cards by bolts 49. The power supply regulating circuitry may be positioned inside the central air distribution box 10 (not shown).

Modifications

A number of modifications may be made to the circuit assembly described above to meet the requirements of different circuit applications.

A limited number of circuit modules may be provided on the interconnecting cards to reduce the number of input and output connections to the circuit cards. Cable connectors may be provided at the edges of some of the circuit cards for direct access to the circuitry on those cards.

Double rows of spring fingers may be provided on each face of the cards for connection double row of printed circuit lands on the air distribution tube. Such a construction would double the number of available input/output connections for each card.

Summary

The circuit assembly described herein provides the high circuit density and relatively short interconnection lengths necessary for high speed electronic circuitry in computers and meets the problems of cooling raised by high packaging density without resort to expensive liquid cooling techniques. In addition the circuit cards can be removed from the assembly and replaced in the event of circuit failures, testing can be carried out without taking the assembly apart by using the probe points provided at the edges of the cards, and it is contemplated that limited wiring changes could be effected by wires soldered into the back of the printed circuit boards forming the air distribution tubes.

What is claimed is:

1. A circuit assembly comprising:

a plurality of printed circuit cards, each supporting and providing electrical interconnections between a plurality of circuit elements arranged around a central aperture in the card;

an elongated member of substantially uniform cross section having rows of electrically conductive conducting lands on its outer surface to connect to said printed circuit cards and a network of conductors interconnecting said circuit lands;

each printed circuit card including a plurality of printed circuit lands adjacent the edges of its central aperture for connection to lands on said elongated member; and, each circuit card being provided with a plurality of spring fingers each soldered to a respective one of printed circuit lands, each spring finger being arranged to connect its respective printed circuit land to a corresponding land on said elongated member.

2. A circuit assembly as claimed in claim 1 in which the apertures of said circuit cards are of substantially the same shape as the cross-section of said elongated member so that the circuit cards are slidable along said elongated member into their operatvie positions.

3. A circuit assembly as claimed in claim 1 including a plurality of spacing elements each being slidable along said elongated member and interposed between adjacent circuit cards on the elongated member for maintaining a predetermined spacing between the circuit cards, and means for maintaining the circuit cards and spacing elements in abutting contact with each other.

4. A circuit assembly as claimed in claim 3 in which each of said spacing elements is formed with a camming surface arranged to move the spring fingers of a circuit card into pressure contact with the lands on the elongated member as the spacing element is moved along the elongated member into abutting contact with the circuit card.

5. A circuit assembly as claimed in claim 4 including at least one interconnecting printed circuit card on said elongated member arranged for connection at its outer edge to one or more cable connectors to provide input and output connections to said circuit elements via the elongated member.

6. A circuit assembly as claimed in claim 1 in which said elongated member is a tube, the walls of which are formed of printed circuit boards, said tube being apertured at positions between said circuit cards, including means for effecting a flow of air through the apertures in the tube to cool the circuit elements.

7. A circuit assembly as claimed in claim 6 including an air guide positioned between each pair of cards for directing the flow of air over the circuit elements.

8. A circuit assembly as claimed in claim 7 in which each air guide includes a portion presenting a plane face towards the circuit elements on an associated card, and a portion arranged to direct the air passing through the apertures in the tube through the space between said plane face and the associated card.

9. A circuit assembly as claimed in claim 8 in which the spaces between each plane face of each air guide and its associated circuit card which are not occupied by a circuit element are blocked so that substantially all air flowing through the apertures in the tube passes over a circuit element.

10. A circuit assembly as claimed in claim 1 in which said circuit elements are micro-modules, each micro-module being formed with extension pins projecting into the air which flows over it so that the flow of the air over the modules is turbulent.

11. A circuit assembly as claimed in claim 1 in which each printed circuit card includes a plurality of probe points distributed around its outer edge connected to points in the circuitry of the card to permit the circuitry to be tested for faults.

12. A circuit assembly as claimed in claim 1 including at least one power bus extending substantially parallel to the longitudinal axis of said interconnecting means or elongated member and fastened to the outer edges of said circuit cards for supplying electrical power to the circuit elements thereon.

13. The assembly defined by claim 6 including a central air box and the tube of said assembly being connected at one end to the air box and being closed at the other end.

14. The assembly of claim 13 including power supply circuitry in said control air box for supplying electrical power to the circuit elements of the assembly.

15. The assembly of claim 13 including means for establishing and maintaining a flow of air from the air box, along the tubes of the circuit assemblies and out of the tubes over the circuit elements.

16. A circuit assembly comprising a plurality of printed cards each having a central aperture, a plurality of circuit elements mounted on each card, a tube extending through the apertures of the cards and having apertures registered with spaces between the cards, and means for effecting a flow of air through the apertures in the tube to cool said circuit elements.

17. A circuit assembly as claimed in claim 16 including a plurality of air flow guides each positioned adjacent an associated card for directing the flow of air from the apertures in the tube over the circuit elements on that card.

18. A circuit assembly as claimed in claim 17 in which each air flow guide includes a portion presenting a plane face towards the circuit elements on the associated card, and a portion to direct the air passing through the apertures in the tube through the space between said plane face and the associated card.

19. A circuit assembly as claimed in claim 18 in which the spaces between the portion of each air flow guide presenting a plane face and the associated circuit card which are not occupied by a circuit element are blocked so that substantially all air flowing through the apertures in the tube passes over a circuit element.

20. A circuit assembly as claimed in claim 16 in which said circuit elements are micro-modules.

21. A circuit assembly as claimed in claim 20 in which each micro-module is formed with extension fins projecting into the air which flows over it so that the flow of air over the modules is turbulent.

22. The circuit assembly of claim 16 including a central air box, the tube of said assembly being connected at one end to said air box and being closed at the other end.

23. A circuit assembly as claimed in claim 22 including means for establishing and maintaining a flow of air from the air box, along the tubes of the sub-assemblies and out of the sub-assemblies over the circuit elements.

References Cited

UNITED STATES PATENTS

| | | | |
|---|---|---|---|
| 2,877,388 | 3/1959 | Reid et al. | 317—101 |
| 3,141,999 | 7/1964 | Schneider | 317—100 |
| 3,181,034 | 4/1965 | Kell et al. | 317—101 |

LEWIS H. MYERS, Primary Examiner

G. P. TOLIN, Assistant Examiner

U.S. Cl. X.R.

317—101